US010342148B2

(12) United States Patent
Wang et al.

(10) Patent No.: US 10,342,148 B2
(45) Date of Patent: Jul. 2, 2019

(54) ELECTRONIC DEVICE

(71) Applicants: Sheng-Hung Wang, Taipei (TW); Hui-Lian Chang, Taipei (TW); Ming-Wang Lin, Taipei (TW); Pan-Jen Chen, Taipei (TW); Wei-Lung Huang, Taipei (TW); Ting-Hui Liao, Taipei (TW)

(72) Inventors: Sheng-Hung Wang, Taipei (TW); Hui-Lian Chang, Taipei (TW); Ming-Wang Lin, Taipei (TW); Pan-Jen Chen, Taipei (TW); Wei-Lung Huang, Taipei (TW); Ting-Hui Liao, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 0 days.

(21) Appl. No.: 15/922,887

(22) Filed: Mar. 15, 2018

(65) Prior Publication Data

US 2018/0303000 A1    Oct. 18, 2018

Related U.S. Application Data

(60) Provisional application No. 62/484,886, filed on Apr. 13, 2017.

(51) Int. Cl.
*H05K 7/02* (2006.01)
*H05K 7/04* (2006.01)
(Continued)

(52) U.S. Cl.
CPC ......... *H05K 5/0226* (2013.01); *G06F 1/1681* (2013.01); *H05K 5/0247* (2013.01)

(58) Field of Classification Search
CPC ................. H05K 5/0226; H05K 5/0247
(Continued)

(56) References Cited

U.S. PATENT DOCUMENTS 8,593,800 B2 * 11/2013 Asakura ............... G06F 1/1616
                                                           16/235
8,780,570 B2 *  7/2014 Bohn ................... H04M 1/022
                                                           361/679.28
(Continued)

FOREIGN PATENT DOCUMENTS

| CN | 102606616 | 7/2012 |
|---|---|---|
| CN | 102572029 | 4/2015 |
| TW | 493684 | 7/2002 |

OTHER PUBLICATIONS

Office Action of Taiwan Counterpart Application, dated Jan. 16, 2019, pp. 1-6.

*Primary Examiner* — Hung S. Bui
(74) *Attorney, Agent, or Firm* — JCIPRNET (57) ABSTRACT

An electronic device includes a first body, a second body, an electrical connection element, and a hinge structure. The electrical connection element is configured to electrically connect the first body with the second body. The hinge structure is configured to pivot the first body with the second body. The hinge structure includes two mounting bases, two first linking assemblies, and a second linking assembly. Each of the mounting bases is connected to the first body and the second body. The two first linking assemblies are respectively pivoted to the two mounting bases. The second linking assembly is disposed between the two mounting bases, and two opposite terminals of the second linking assembly are movably connected to the two mounting bases respectively. The second linking assembly has a receding space configured to accommodate a portion of the electrical connection element.

12 Claims, 6 Drawing Sheets

(51) Int. Cl.
*H05K 5/02* (2006.01)
*G06F 1/16* (2006.01)

(58) Field of Classification Search
USPC .................................................. 361/809–810
See application file for complete search history.

(56) References Cited

U.S. PATENT DOCUMENTS

| | | | |
|---|---|---|---|
| 9,507,388 B1 * | 11/2016 | Hampton | .............. G06F 1/1681 |
| 9,535,465 B2 * | 1/2017 | Bohn | .................... G06F 1/1616 |
| 2005/0055807 A1 | 3/2005 | Maatta et al. | |
| 2012/0206864 A1 | 8/2012 | Bohn et al. | |

* cited by examiner

ELECTRONIC DEVICE

CROSS-REFERENCE TO RELATED APPLICATION

This application claims the priority benefit of U.S. provisional application Ser. No. 62/484,886, filed on Apr. 13, 2017. The entirety of the above-mentioned patent application is hereby incorporated by reference herein and made a part of this specification.

BACKGROUND OF THE INVENTION

1. Field of the Invention

The invention relates to an electronic device. More particularly, the invention relates to an electronic device including two bodies pivoted to each other.

2. Description of Related Art

In a common electronic device, such as a notebook computer or a foldable display device, a hinge structure is used most of the time to pivot the host with the display or to pivot two displays. In another aspect, the trace configured to electrically connect the host with the display passes through the hinge structure most of the time from the host and extends to the display or passes through the hinge structure from the display and extends to the host. The trace configured to electrically connect two displays passes through the hinge structure most of the time from one of the displays and extends to the other display. Nevertheless, if the hinge structure is improperly designed, insufficient trace space may be obtained, and relative pivoting between the host and the display or relative pivoting between the two displays may be affected.

SUMMARY OF THE INVENTION

The invention provides an electronic device having a greater trace space.

In an embodiment of the invention, an electronic device includes a first body, a second body, an electrical connection element, and a hinge structure. The electrical connection element is configured to electrically connect the first body with the second body. The hinge structure is configured to pivot the first body with the second body. The hinge structure includes two mounting bases disposed oppositely, two first linking assemblies, and a second linking assembly. Each of the mounting bases is connected to the first body and the second body. The two first linking assemblies are respectively pivoted to the two mounting bases. The second linking assembly is disposed between the two mounting bases, and two opposite terminals of the second linking assembly are movably connected to the two mounting bases respectively. The second linking assembly has a receding space. The electrical connection element passes below the second linking assembly from the first body and extends to the second body, and a portion of the electrical connection element is located in the receding space.

In an embodiment of the invention, each of the mounting bases includes a first base and a second base opposite to each other. Each of the first bases is secured to the corresponding first body, each of the second bases is secured to the corresponding second body. Each of the first linking assemblies is disposed between the corresponding first base and the second base.

In an embodiment of the invention, each of the first bases has a first notch, and each of the second bases has a second notch. The first notch of each of the first bases is connected to the second notch of the corresponding second base to form an accommodating groove to form an accommodating groove, and each of the first linking assemblies is disposed in the corresponding accommodating groove.

In an embodiment of the invention, each of the first linking assemblies includes a first linkage and a second linkage pivoted to each other. One terminal of each of the first linkages is pivoted to the corresponding second base, and the other terminal of each of the first linkages is slidably connected to the corresponding first base. One terminal of each of the second linkages is pivoted to the corresponding first base, and the other terminal of each of the second linkages is slidably connected to the corresponding second base.

In an embodiment of the invention, each of the first linking assemblies further includes a first shaft, a second shaft, a third shaft, a fourth shaft, and a fifth shaft. Each of the first shafts penetrates through the corresponding first linkage and the second linkage. Each of the first linkages is connected to the corresponding second shaft and is pivoted to the corresponding second base through the corresponding second shaft. Each of the second linkages is connected to the corresponding third shaft and is pivoted to the corresponding first base through the corresponding third shaft. Each of the fourth shafts penetrates through the corresponding first linkage and is slidably connected to the corresponding first base. Each of the fifth shafts penetrates through the corresponding second linkage and is slidably connected to the corresponding second base.

In an embodiment of the invention, one of the first shafts penetrates the corresponding second linkage, passes above the corresponding mounting base, and penetrates into one terminal of the second linking assembly, and the other one of the first shafts penetrates the corresponding first linkage, passes above the corresponding mounting base, and penetrates into the other terminal of the second linking assembly.

In an embodiment of the invention, the two fourth shafts respectively penetrate through the two first bases and penetrate into the two opposite terminals of the second linkage assembly, and the two fifth shafts respectively penetrate through the two second bases and penetrate into the two opposite terminals of the second linkage assembly.

In an embodiment of the invention, the second linking assembly includes a first linking arm and a second linking arm pivoted to each other. One of the first shafts penetrates the corresponding second linkage, passes above the corresponding mounting base, and penetrates into one ten final of the first linking arm, and the other one of the first shafts penetrates the corresponding first linkage, passes above the corresponding mounting base, and penetrates into one terminal of the second linking arm.

In an embodiment of the invention, the two fourth shafts respectively penetrate through the two first bases and penetrate into two opposite terminals of the first linking arm, and the two fifth shafts respectively penetrate through the two second bases and penetrate into two opposite terminals of the second linking arm.

In an embodiment of the invention, the second linking assembly includes a first linking arm and a second linking arm pivoted to each other, two opposite terminals of the first linking arm are slidably connected to the two first bases disposed oppositely, and the second linking arm is slidably connected to the two second bases disposed oppositely.

In an embodiment of the invention, the first linking arm has a first recessed surface, the second linking arm has a second recessed surface facing a same side with the first recessed surface, and the first recessed surface and the second recessed surface form the receding space.

In an embodiment of the invention, the electrical connection element passes below the first linking arm from the first body, passes below the first recessed surface, below the second recessed surface, and below the second linking arm in sequence, and extends to the second body.

To sum up, in the electronic device provided by the embodiments of the invention, the receding space is disposed in the hinge structure, and at least a portion of the electrical connection element (e.g., a flexible circuit board, a power line, a signal line, a ground line, or an antenna) electrically connecting the first body with the second body may be accommodated in the receding space, a greater trace space is therefore obtained.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the disclosure, examples of which are illustrated in the accompanying drawings. Wherever possible, the same reference numbers are used in the drawings and the description to refer to the same or like parts.

Figure 1:
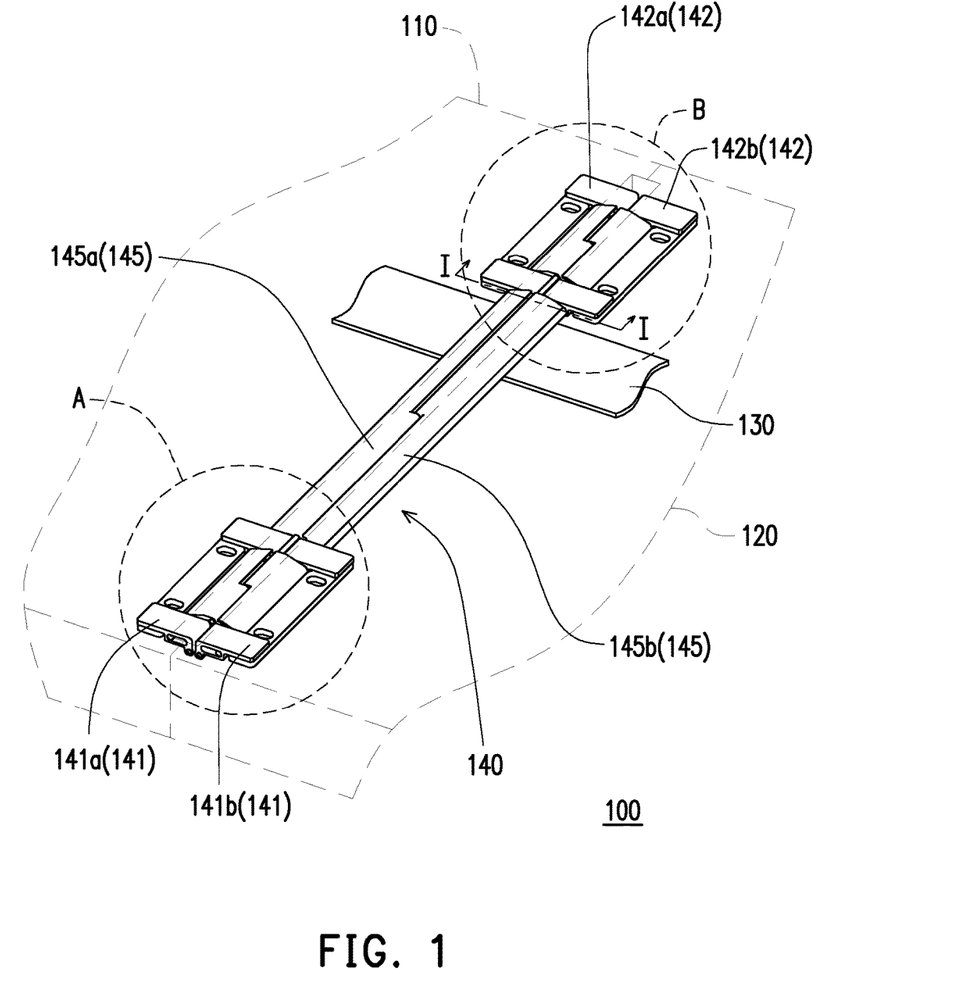
FIG. 1 is a schematic view of an electronic device according to an embodiment of the invention.

FIG. 1 is a schematic view of an electronic device according to an embodiment of the invention. In order to provide clear illustration and better explanation, a first body 110 and a second body 120 are schematically illustrated with dotted lines. With reference to FIG. 1, an electronic device 100 may be a notebook computer or a foldable display device and includes the first body 110 and the second body 120 pivoted to each together in this embodiment. For instance, the first body 110 may be a host with a keyboard set, and the second body 120 may be a display. Alternatively, the first body 110 and the second body 120 may be two displays oppositely connected to each other.

Further, the electronic device 100 further includes an electrical connection element 130 and a hinge structure 140. The electrical connection element 130 is configured to electrically connect the first body 110 with the second body 120. Further, the electrical connection element 130 may be a flexible circuit board, a power line, a signal line, a ground line, or an antenna, so as to allow the first body 110 and the second body 120 to transmit signals or electrical energy to each other. The hinge structure 140 is configured to pivot the first body 110 with the second body 120. That is, the first body 110 and the second body 120 may rotate relatively through the hinge structure 140.

Figure 2:
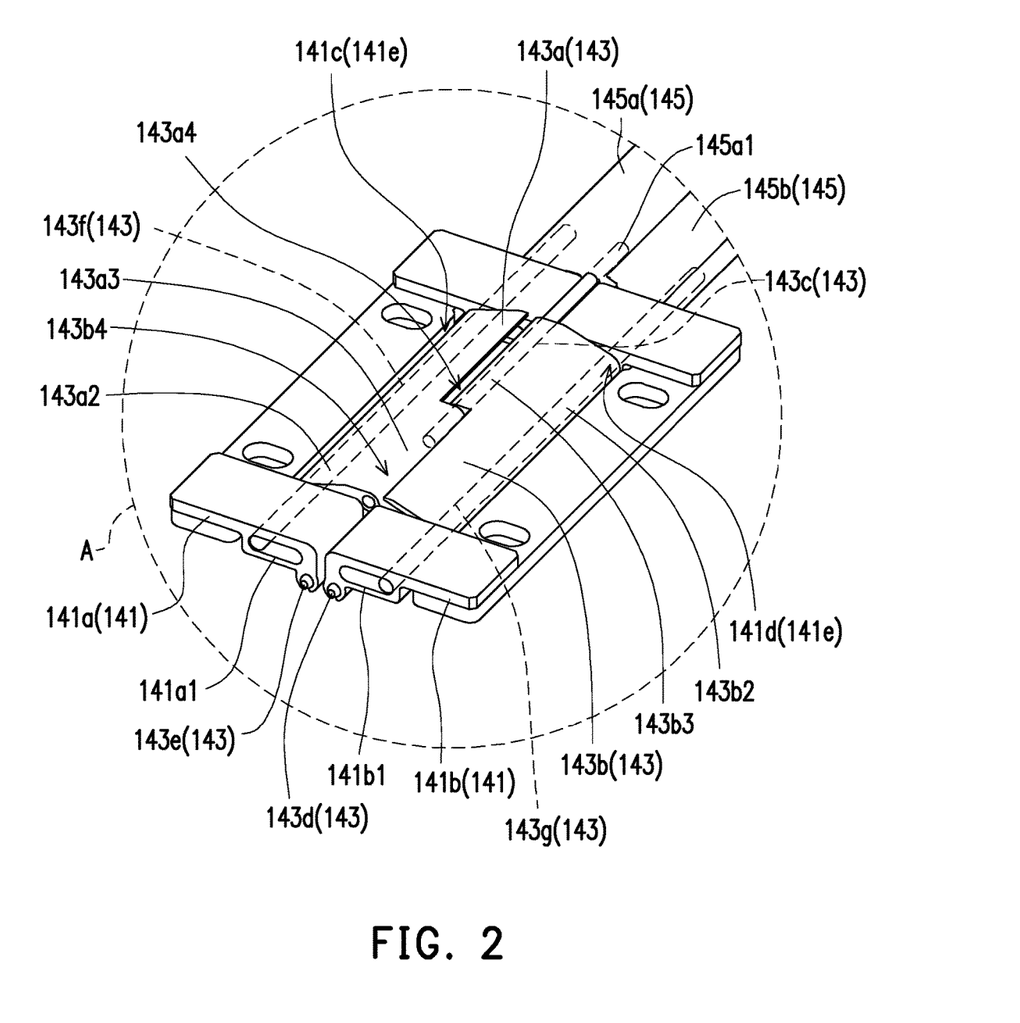
FIG. 2 is a schematic enlarged view of the electronic device of FIG. 1 in a region A.
Figure 3:
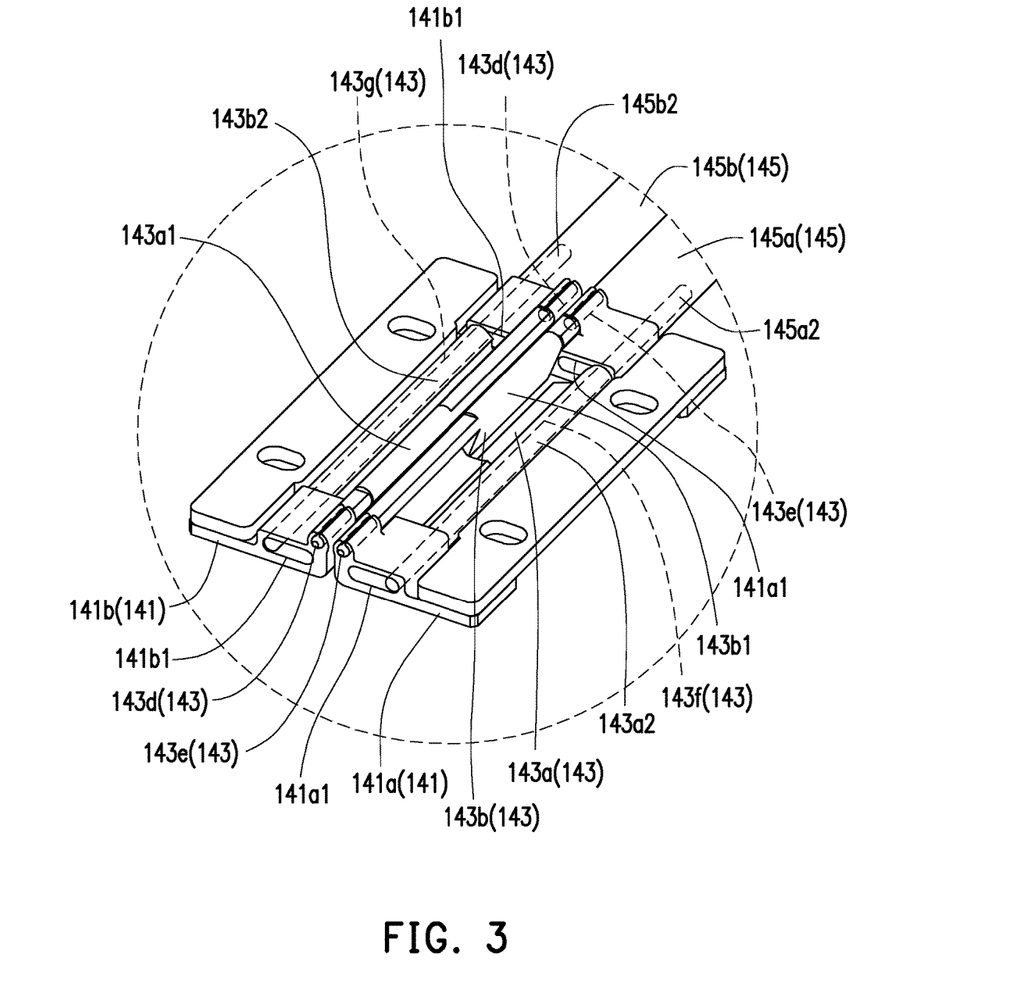
FIG. 3 is a schematic view of FIG. 2 from another perspective.
Figure 4:
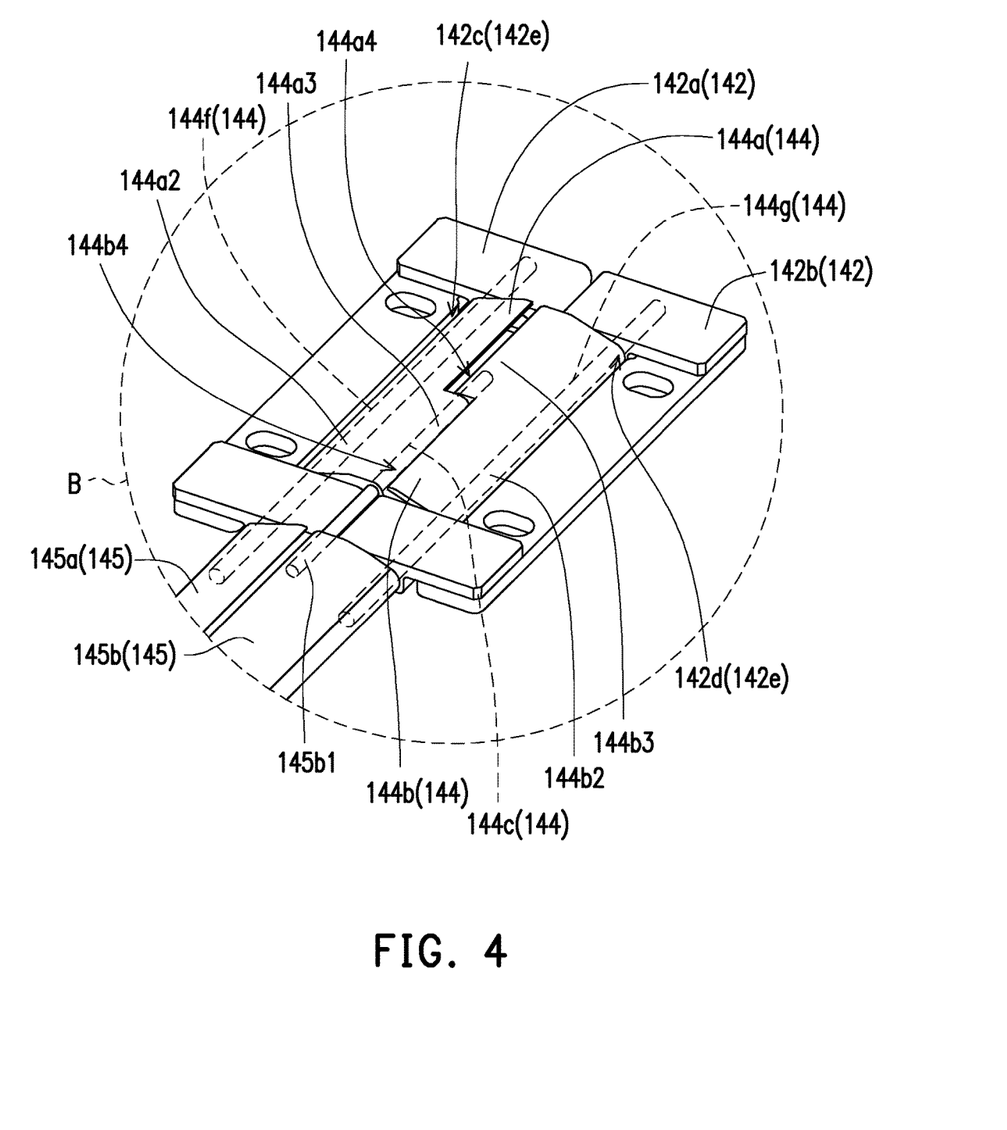
FIG. 4 is a schematic enlarged view of the electronic device of FIG. 1 in a region B.
Figure 5:
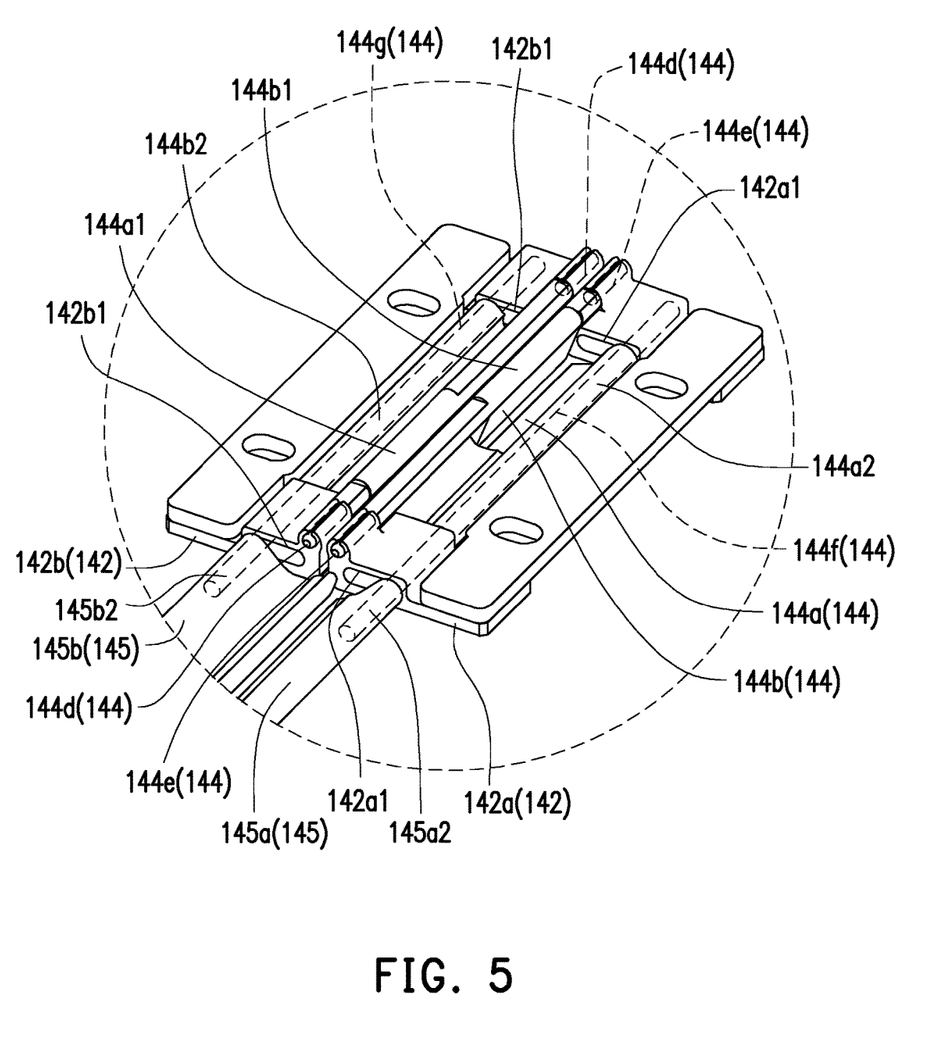
FIG. 5 is a schematic view of FIG. 4 from another perspective.

FIG. 2 is a schematic enlarged view of the electronic device of FIG. 1 in a region A. FIG. 3 is a schematic view of FIG. 2 from another perspective. FIG. 4 is a schematic enlarged view of the electronic device of FIG. 1 in a region B. FIG. 5 is a schematic view of FIG. 4 from another perspective. In order to provide better explanation, the first body 110 and the second body 120 are omitted from FIG. 2 to FIG. 5. With reference to FIG. 1 to FIG. 5, the hinge structure 140 includes a mounting base 141, a mounting base 142, a first linking assembly 143, a first linking assembly 144, and a second linking assembly 145 in this embodiment. The mounting base 141 and the mounting base 142 are oppositely disposed and are symmetrically disposed in the electronic device 100 substantially. The mounting base 141 connects the first body 110 with the second body 120, wherein the mounting base 141 includes a first base 141a and a second base 141b that are arranged in a side-by-side manner. The first base 141a is secured to the first body 110, and the second base 141b is secured to the second body 120. In another aspect, the mounting base 142 connects the first body 110 with the second body 120, wherein the mounting base 142 includes a first base 142a and a second base 142b. The first base 142a is secured to the first body 110, and the second base 142b is secured to the second body 120.

The first linking assembly 143 is pivoted to the mounting base 141 and is disposed between the first base 141a and the second base 141b. Further, the first base 141a has a first notch 141c, and the second base 141b has a second notch 141d. The first notch 141c and the second notch 141d are connected and form an accommodating groove 141e configured to accommodate the first linking assembly 143. In another aspect, the first linking assembly 144 is pivoted to the mounting base 142 and is disposed between the first base 142a and the second base 142b. Further, the first base 142a has a first notch 142c, and the second base 142b has a second notch 142d. The first notch 142c and the second notch 142d are connected and form an accommodating groove 142e configured to accommodate the first linking assembly 143. The first linking assembly 143 is disposed in the accommodating groove 141e, and the first linking assembly 144 is disposed in the accommodating groove 142e, a size of the hinge structure 140, for example, an overall thickness of the hinge structure 140, is thereby decreased.

In this embodiment, the first linking assembly 143 includes a first linkage 143a and a second linkage 143b pivoted to each other. The first linkage 143a has a pivoting terminal 143a1 and a sliding terminal 143a2 opposite to each other. The pivoting terminal 143a1 is pivoted to the second base 141b, and the sliding terminal 143a2 is slidably connected to the first base 141a. That is, the first linkage 143a can be rotated relative to the second base 141b and slides relative to the first base 141a. The second linkage 143b also has a pivoting terminal 143b1 and a sliding terminal 143b2 opposite to each other, wherein the pivoting terminal 143b1 is pivoted to the first base 141a, and the sliding terminal 143b2 is slidably connected to the second base 141b. That is, the second linkage 143b can be rotated relative to the first base 141a and slides relative to the second base 141b.

In another aspect, the first linkage 143a also has a pivoting terminal 143a3, and the pivoting terminal 143a1 and the sliding terminal 143a2 are respectively located at two opposite sides of the pivoting terminal 143a3. The second linkage 143b also has a pivoting terminal 143b3, and the pivoting terminal 143b1 and the sliding terminal 143b2 are respectively located at two opposite sides of the pivoting terminal 143b3. The pivoting terminal 143a3 and the pivoting terminal 143b3 are aligned with and pivoted to each other. The first linkage 143a further includes a receding groove 143a4 adjacent to the pivoting terminal 143a3, and the second linkage 143b further includes a receding groove 143b4 adjacent to the pivoting terminal 143b3. The receding groove 143a4 is configured to accommodate the pivoting terminal 143b3, and the receding groove 143b4 is configured to accommodate the pivoting terminal 143a3.

The first linking assembly 143 further includes a first shaft 143c, a second shaft 143d, a third shaft 143e, a fourth shaft 143f, and a fifth shaft 143g. The first shaft 143c penetrates through the aligned pivoting terminal 143a3 and the pivoting terminal 143b3 to act as a pivot shaft pivoting the first linkage 143a with the second linkage 143b. The second shaft 143d is formed at two opposite terminals of the pivoting terminal 143a1, meaning that the second shaft 143d extends from two opposite sides of the pivoting terminal 143a1 and penetrates into the second base 141b to act as a pivot shaft pivoting the first linkage 143a with the second base 141b. The third shaft 143e is formed at two opposite terminals of the pivoting terminal 143b1, meaning that the third shaft 143e extends from two opposite sides of the pivoting terminal 143b1 and penetrates into the first base 141a to act as a pivot shaft pivoting the second linkage 143b with the first base 141a.

In another aspect, the fourth shaft 143f penetrates through the sliding terminal 143a2, wherein two opposite ends of the fourth shaft 143f respectively penetrates two opposite sides of the sliding terminal 143a2 and penetrates into two opposite sliding grooves 141a1 of the first base 141a to act as a sliding rod slidably connecting the first linkage 143a with the first base 141a. The fifth shaft 143g penetrates through the sliding terminal 143b2, wherein two opposite ends of the fifth shaft 143g respectively penetrates two opposite sides of the sliding terminal 143b2 and penetrates into two opposite sliding grooves 141b1 of the second base 141b to act as a sliding rod slidably connecting the second linkage 143b with the second base 141b. In terms of relative positions among the second shaft 143d, the third shaft 143e, the fourth shaft 143f, and the fifth shaft 143g, the fourth shaft 143f and the second shaft 143d are respectively located at two opposite sides of the third shaft 143e, and the fifth shaft 143g and the third shaft 143e are respectively located at two opposite sides of the second shaft 143d.

In this embodiment, the first linking assembly 144 includes a first linkage 144a and a second linkage 144b pivoted to each other. The first linkage 144a has a pivoting terminal 144a1 and a sliding terminal 144a2 opposite to each other. The pivoting terminal 144a1 is pivoted to the second base 142b, and the sliding terminal 144a2 is slidably connected to the first base 142a. That is, the first linkage 144a can be rotated relative to the second base 142b and slides relative to the first base 142a. The second linkage 144b also has a pivoting terminal 144b1 and a sliding terminal 144b2 opposite to each other, wherein the pivoting terminal 144b1 is pivoted to the first base 142a, and the sliding terminal 144b2 is slidably connected to the second base 142b. That is, the second linkage 144b can be rotated relative to the first base 142a and slides relative to the second base 142b. In another aspect, the first linkage 144a further includes a pivoting terminal 144a3, and the pivoting terminal 144a1 and the sliding terminal 144a2 are respectively located at two opposite sides of the pivoting terminal 144a3. The second linkage 144b also has a pivoting terminal 144b3, and the pivoting terminal 144b1 and the sliding terminal 144b2 are respectively located at two opposite sides of the pivoting terminal 144b3. The pivoting terminal 144a1 and the pivoting terminal 144b3 are aligned with and pivoted to each other. The first linkage 144a further includes a receding groove 144a4 adjacent to the pivoting terminal 144a3, and the second linkage 144b further includes a receding groove 144b4 adjacent to the pivoting terminal 144b3. The receding groove 144b4 is configured to accommodate the pivoting terminal 144a3, and the receding groove 144a4 is configured to accommodate the pivoting terminal 144b3.

The first linking assembly 144 further includes a first shaft 144c, a second shaft 144d, a third shaft 144e, a fourth shaft 144f, and a fifth shaft 144g. The first shaft 144c penetrates through the aligned pivoting terminal 144a3 and the pivoting terminal 144b3 to act as a pivot shaft pivoting the first linkage 144a with the second linkage 144b. The second shaft 144d is formed at two opposite sides of the pivoting terminal 144a1, meaning that the second shaft 144d extends from two opposite sides of the pivoting terminal 144a1 and penetrates into the second base 142b to act as a pivot shaft pivoting the first linkage 144a with the second base 142b. The third shaft 144e is formed at two opposite sides of the pivoting terminal 144b1, meaning that the third shaft 144e extends from two opposite sides of the pivoting terminal 144b1 and penetrates into the first base 142a to act as a pivot shaft pivoting the second linkage 144b with the first base 142a.

In another aspect, the fourth shaft 144f penetrates through the sliding terminal 144a2, wherein two opposite ends of the fourth shaft 144f respectively penetrates two opposite sides of the sliding terminal 144a2 and penetrates into two opposite sliding grooves 142a1 of the first base 142a to act as a sliding rod slidably connecting the first linkage 144a with the first base 142a. The fifth shaft 144g penetrates through the sliding terminal 144b2, wherein two opposite ends of the fifth shaft 144g respectively penetrates two opposite sides of the sliding terminal 144b2 and penetrates into two opposite sliding grooves 142b1 of the second base 142b to act as a sliding rod slidably connecting the second linkage 144b with the second base 142b. In terms of relative positions among the second shaft 144d, the third shaft 144e, the fourth shaft 144f, and the fifth shaft 144g, the fourth shaft 144f and the second shaft 144d are respectively located at two opposite sides, and the fifth shaft 144g and the third shaft 144e are respectively located at two opposite sides of the second shaft 144d.

Figure 6:
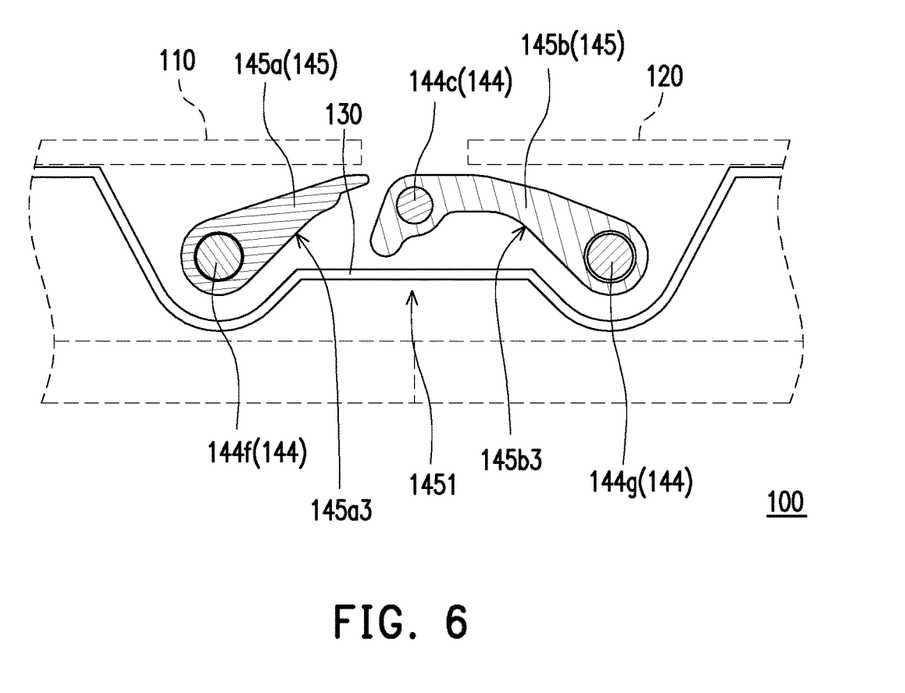
FIG. 6 is a schematic cross-sectional view of the electronic device of FIG. 1 taken along a line I-I.

FIG. 6 is a schematic cross-sectional view of the electronic device of FIG. 1 taken along a line I-I. With reference to FIG. 1 to FIG. 6, in this embodiment, the second linking assembly 145 is disposed between the mounting base 141 and the mounting base 142, that is, a middle section in the hinge structure 140. Two opposite terminals of the second linking assembly 145 are movably connected to the mounting base 141 and the mounting base 142 respectively, and the second linking assembly 145 is configured to move simultaneously with the first linking assembly 143 and the first linking assembly 144. The second linking assembly 145 has a receding space 1451. The electrical connection element 130 passes below the second linking assembly 145 from the first body 110 and extends to the second body 120, and a portion of the electrical connection element 130 is located in the receding space 1451. Further, the receding space 1451 is located at the middle section of the hinge structure 140 to act as a trace space of the electrical connection element 130. Since no rotating shaft is disposed in the receding space 1451, the electrical connection element 130 being applied by a force may generate adequate displacement in the receding space 1451. As such, when the hinge structure 140 operates, the electrical connection element 130 is prevented from interfering with the hinge structure 140, and the hinge structure 140 is prevented from being entangled with the electrical connection element 130.

In another aspect, one terminal of the second linking assembly 145 is pivoted to the second linkage 143b, and the other terminal is pivoted to the first linkage 144a. Further, the first shaft 143c penetrates the second linkage 143b and passes above the mounting base 141 and penetrates into one terminal of the second linking assembly 145, and the first shaft 144c penetrates the first linkage 144a and passes above the mounting base 142 and penetrates into the other terminal of the second linking assembly 145. That is, the first shaft 143c may act as a pivot shaft pivoting the second linkage 143b with the second linking assembly 145, and the first shaft 144c may act as a pivoting shaft pivoting the first linkage 144a with the second linking assembly 145. Further, the second linking assembly 145 includes a first linking arm 145a and a second linking arm 145b pivoted to each other. The first linking arm 145a has a pivoting terminal 145a1 adjacent to the mounting base 141, and the second linking arm 145b has a pivoting terminal 145b1a adjacent to the mounting base 142. The first shaft 143c penetrates the second linkage 143b and passes above the mounting base 141 and penetrates into the pivoting terminal 145a1 of the first linking arm 145a, and the first shaft 144c penetrates the first linkage 144a and passes above the mounting base 142 and penetrates into the pivoting terminal 145b1 of the second linking arm 145b.

In this embodiment, the first linking arm 145a further includes a sliding terminal 145a2 opposite to the pivoting terminal 145a1, and the second linking arm 145b further includes a sliding terminal 145b2a opposite to the pivoting terminal 145b1. A sliding terminal 145a2 of the first linking arm 145a is slidably connected to the first base 141a and the first base 142a disposed oppositely, and the sliding terminal 145b2 of the second linking arm 145b is slidably connected to the second base 141b and the second base 142b disposed oppositely. Specifically, after the fourth shaft 143f penetrates through the sliding grooves 141a1 of the first base 141a, one end of the fourth shaft 143f extends into the middle section of the hinge structure 140 and penetrates into one side of the sliding terminal 145a2. Moreover, after the fourth shaft 144f penetrates through the sliding grooves 141a1 of the first base 142a, one end of the fourth shaft 144f extends into the middle section of the hinge structure 140 and penetrates into the other side of the sliding terminal 145a2. In another aspect, after the fifth shaft 143g penetrates through the sliding grooves 141b1 of the second base 141b, one end of the fifth shaft 143g extends into the middle section of the hinge structure 140 and penetrates into one side of the sliding terminal 145b2. Moreover, after the fifth shaft 144g penetrates through the sliding grooves 142b1 of the second base 142b, one end of the fifth shaft 144g extends into the middle section of the hinge structure 140 and penetrates into the other side of the sliding terminal 145b2.

For instance, the electronic device 100 shown in FIG. 1 is in an unfolded state, and an unfolding angle of the second body 120 relative to the first body 110 is 180 degrees. When the electronic device 100 is changed from the unfolding state to a folded state, the second body 120 and the first body 110 rotate relatively. Taking the first linking assembly 143 for example, when the second body 120 and the first body 110 rotate relatively, the first linkage 143a rotates relative to the second base 141b and slides relative to the first base 141a, and the second linkage 143b rotates relative to the first base 141a and slides relative to the second base 141b owing to pivoting relations among the first linkage 143a, the second linkage 143b, and the first linking arm 145a; a sliding relation between the first linking arm 145a and the first linkage 143a relative to the first base 141a; a pivoting relation between the first linking arm 145a and the second linking arm 145b; and a sliding relation between the second linking arm 145b and the second linkage 143b relative to the second base 141b. As such, the first linking arm 145a and the second linking arm 145b may be enabled by the first linkage 143a and the second linkage 143b to rotate and slide simultaneously. Based on similar mechanical design, the first linking arm 145a and the second linking arm 145b may also be enabled by the first linkage 144a and the second linkage 144b to rotate and slide simultaneously. Descriptions of connection relations among components may be referenced to the above, and thus, a relevant description thereof is thus omitted.

With reference to FIG. 1 and FIG. 6, the first linking arm 145a has a first recessed surface 145a3 distant from the components in the first body 110, and the second linking arm 145b has a second recessed surface 145b3 distant from the components in the second body 120. The first recessed surface 145a3 and the second recessed surface 145b3 face a same side to form the receding space 1451. To be specific, the electrical connection element 130 passes below the first linking arm 145a from the first body 110, passes below the first recessed surface 145a3, below the second recessed surface 145b3, and below the second linking arm 145b in sequence, and extends to the second body 120.

Since no rotating shaft nor sliding rod is disposed in the receding space 1451, and at least a portion of the electrical connection element 130 may be contained in the receding space 1451, a greater trace space may thus be obtained to accommodate more electrical connection elements 130. In another aspect, when the first body 110 and the second body 120 rotate relatively, the electrical connection element 130 being applied by a force may generate adequate displacement in the receding space 1451. As such, when the hinge structure 140 operates, the electrical connection element 130 is prevented from interfering with the hinge structure 140, and the hinge structure 140 is prevented from being entangled with the electrical connection element 130.

In view of the foregoing, in the electronic device provided by the embodiments of the invention, the receding space is disposed at the middle section of the hinge structure, and the electrical connection element (e.g., a flexible circuit board, a power line, a signal line, a ground line, or an antenna) electrically connecting the first body with the second body may pass below the middle section of the hinge structure from the first body and extends to the second body. Moreover, a portion of the electrical connection element may be accommodated in the receding space. Since no rotating shaft nor sliding rod is disposed in the receding space, and at least a portion of the electrical connection element may be contained in the receding space, a greater trace space is thus obtained to accommodate more electrical connection elements. In another aspect, when the first body and the second body rotate relatively, the electrical connection element being applied by a force may generate adequate displacement in the receding space. As such, when the hinge structure operates, the electrical connection element is prevented from interfering with the hinge structure, and the hinge structure is prevented from being entangled with the electrical connection element.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic device, comprising,
a first body;
a second body;
an electrical connection element, configured to electrically connect the first body and the second body; and
a hinge structure, configured to pivot the first body with the second body, the hinge structure comprising:
two mounting bases disposed opposite to each other, each of the mounting bases being connected to the first body and the second body;
two first linking assemblies, respectively pivoted to the two mounting bases; and
a second linking assembly, disposed between the two mounting bases, two opposite terminals of the second linking assembly being rotatably and slidably connected to the two mounting bases respectively, the second linking assembly having a receding space, wherein the electrical connection element passes below the second linking assembly from the first body and extends to the second body, and a portion of the electrical connection element is located in the receding space.

2. The electronic device as claimed in claim 1, wherein each of the mounting bases comprises a first base and a second base opposite to each other, each of the first bases is secured to the corresponding first body, each of the second bases is secured to the corresponding second body, and each of the first linking assemblies is disposed between the corresponding first base and the second base.

3. The electronic device as claimed in claim 2, wherein each of the first bases has a first notch, and each of the second bases has a second notch, the first notch of each of the first bases is connected to the second notch of the corresponding second base to form an accommodating groove, and each of the first linking assemblies is disposed in the corresponding accommodating groove.

4. The electronic device as claimed in claim 2, wherein each of the first linking assemblies comprises a first linkage and a second linkage pivoted to each other, one terminal of each of the first linkages is pivoted to the corresponding second base, the other terminal of each of the first linkages is slidably connected to the corresponding first base, one terminal of each of the second linkages is pivoted to the corresponding first base, and the other terminal of each of the second linkages is slidably connected to the corresponding second base.

5. The electronic device as claimed in claim 4, wherein each of the first linking assemblies further comprises a first shaft, a second shaft, a third shaft, a fourth shaft, and a fifth shaft, each of the first shafts penetrates through the corresponding first linkage and the second linkage, each of the first linkages is connected to the corresponding second shaft and is pivoted to the corresponding second base through the corresponding second shaft, each of the second linkages is connected to the corresponding third shaft and is pivoted to the corresponding first base through the corresponding third shaft, each of the fourth shafts penetrates through the corresponding first linkage and is slidably connected to the corresponding first base, and each of the fifth shafts penetrates through the corresponding second linkage and is slidably connected to the corresponding second base.

6. The electronic device as claimed in claim 5, wherein one of the two first shafts penetrates the corresponding second linkage, passes above the corresponding mounting base, and penetrates into one terminal of the second linking assembly, and the other one of the two first shafts penetrates the corresponding first linkage, passes above the corresponding mounting base, and penetrates into the other terminal of the second linking assembly.

7. The electronic device as claimed in claim 5, wherein the two fourth shafts respectively penetrate through the two first bases and penetrate into the two opposite terminals of the second linkage assembly, and the two fifth shafts respectively penetrate through the two second bases and penetrate into the two opposite terminals of the second linkage assembly.

8. The electronic device as claimed in claim 5, wherein the second linking assembly comprises a first linking arm and a second linking arm pivoted to each other, one of the two first shafts penetrates the corresponding second linkage, passes above the corresponding mounting base, and penetrates into one terminal of the first linking arm, and the other one of the two first shafts penetrates the corresponding first linkage, passes above the corresponding mounting base, and penetrates into one terminal of the second linking arm.

9. The electronic device as claimed in claim 8, the two fourth shafts respectively penetrate through the two first bases and penetrate into two opposite terminals of the first linking arm, and the two fifth shafts respectively penetrate through the two second bases and penetrate into two opposite terminals of the second linking arm.

10. The electronic device as claimed in claim 2, wherein the second linking assembly comprises a first linking arm and a second linking arm pivoted to each other, two opposite terminals of the first linking arm are slidably connected to the two first bases disposed oppositely, and the second linking arm is slidably connected to the two second bases disposed oppositely.

11. The electronic device as claimed in claim 10, wherein the first linking arm has a first recessed surface, the second linking arm has a second recessed surface facing a same side with the first recessed surface, and the first recessed surface and the second recessed surface form the receding space.

12. The electronic device as claimed in claim 11, wherein the electrical connection element passes below the first linking arm from the first body, passes below the first recessed surface, below the second recessed surface, and below the second linking arm in sequence, and extends to the second body.

* * * * *